United States Patent
Terada et al.

(10) Patent No.: US 10,491,976 B2
(45) Date of Patent: Nov. 26, 2019

(54) ELECTRONIC CONTROL APPARATUS

(71) Applicant: DENSO TEN Limited, Kobe-shi, Hyogo (JP)

(72) Inventors: Yohei Terada, Kobe (JP); Kohta Minematsu, Kobe (JP); Yuya Sakai, Kobe (JP); Ryosuke Yamamoto, Kobe (JP)

(73) Assignee: DENSO TEN Limited, Kobe-shi (JP)

( * ) Notice: Subject to any disclaimer, the term of this patent is extended or adjusted under 35 U.S.C. 154(b) by 0 days.

(21) Appl. No.: 16/122,228

(22) Filed: Sep. 5, 2018

(65) Prior Publication Data
US 2019/0149900 A1     May 16, 2019

(30) Foreign Application Priority Data
Nov. 13, 2017   (JP) .................. 2017-217948

(51) Int. Cl.
| H04R 1/28 | (2006.01) |
| H04R 1/02 | (2006.01) |
| H04R 1/06 | (2006.01) |
| H03G 3/02 | (2006.01) |

(52) U.S. Cl.
CPC ............ H04R 1/025 (2013.01); H03G 3/02 (2013.01); H04R 1/06 (2013.01)

(58) Field of Classification Search
USPC .................. 381/354, 386, 388, 392
See application file for complete search history.

(56) References Cited

U.S. PATENT DOCUMENTS 6,526,150 B2 * 2/2003 Kelly ............ H04M 1/03
379/430

FOREIGN PATENT DOCUMENTS

| JP | 2002-010387 A | 1/2002 |
| JP | 2014-142944 A | 8/2014 |
| JP | 2017-120498 A | 7/2017 |

* cited by examiner

*Primary Examiner* — Suhan Ni
(74) *Attorney, Agent, or Firm* — Oliff PLC

(57) ABSTRACT

An electronic control apparatus includes: a circuit board; a holder provided to an upper side of the circuit board; a loudspeaker mounted on the holder; a cushioning member that i) is elastic and ii) is mounted on an upper side of the loudspeaker; and a case that i) is in contact with the cushioning member and ii) houses the circuit board, the holder and the loudspeaker. Thus, the electronic control apparatus including the loudspeaker outputs sound at a high volume.

8 Claims, 9 Drawing Sheets

ELECTRONIC CONTROL APPARATUS

BACKGROUND OF THE INVENTION

Field of the Invention

The invention relates to a technology for an electronic control apparatus including a loudspeaker.

Description of the Background Art

Conventionally, drive recorders including a loudspeaker have been known. An aperture for sound output from the loudspeaker is provided on a front side of a body of some of those drive recorders.

In a case of the drive recorder of which the body has the aperture for the sound output from the loudspeaker, there is a possibility that a dust, dirt and the like enter an interior of the drive recorder from the aperture for the sound output. On the other hand, in a case of a drive recorder of which a body has no aperture for the sound output, sound needs to be output at a high volume from the drive recorder for easy listening. Moreover, some of in-vehicle apparatuses, such as a drive recorder, are provided inside a dashboard of a vehicle. Therefore, loudspeakers that are provided to those in-vehicle apparatuses, such as the drive recorder, need to be capable of outputting sound at a high volume so that a passenger in the vehicle can listen to the sound.

SUMMARY OF THE INVENTION

According to one aspect of the invention, an electronic control apparatus includes: a first circuit board; a holder provided to an upper side of the first circuit board; a loudspeaker mounted on the holder; a cushioning member that is elastic and is mounted on an upper side of the loudspeaker; and a case that is in contact with the cushioning member, and that houses the first circuit board, the holder and the loudspeaker.

Thus, the electronic control apparatus including the loudspeaker outputs sounds at a high volume.

According to another aspect of the invention, the electronic control apparatus further includes a double-faced adhesive tape that is provided between the holder and the loudspeaker in an up-down direction, and that adheres to the holder and the loudspeaker to each other.

This configuration can prevent a void from occurring behind a rear surface (a lower surface) of the loudspeaker so that vibrations of sounds produced by the loudspeaker can be transmitted with small loss.

Therefore, an object of the invention is to provide a technology for outputting sounds at a high volume from an electronic control apparatus including a loudspeaker.

These and other objects, features, aspects and advantages of the invention will become more apparent from the following detailed description of the invention when taken in conjunction with the accompanying drawings.

DESCRIPTION OF THE EMBODIMENTS

Figure 1:
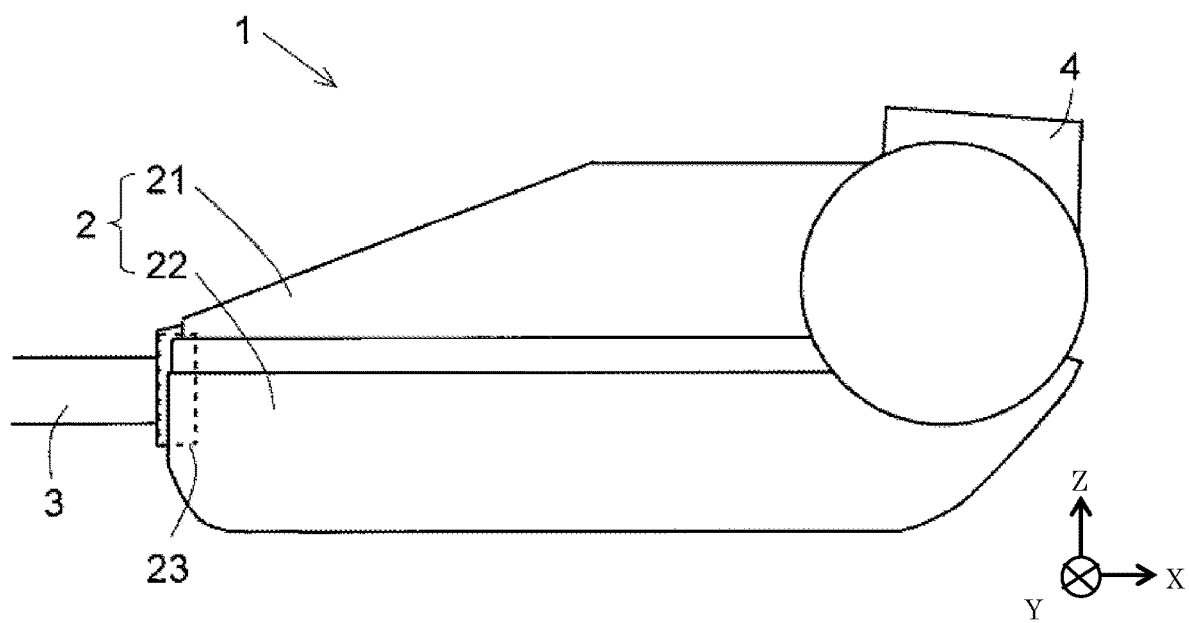
FIG. 1 illustrates a simplified side view of an electronic control apparatus of this embodiment.

An embodiment of the present application will be described, as examples, hereinafter in detail with reference to the drawings. In this specification, an up-down direction is defined as a direction that is orthogonal to a surface of a circuit board 5 on which electronic parts are mounted illustrated in FIG. 2. A side of the circuit board 5 on which a loudspeaker 6 is provided is defined as an upper side. A front-back direction is orthogonal to the up-down direction, and is defined as a direction in which a cable 3 extends through a through hole 23 on a case 2 illustrated in FIG. 1. A side to which the through hole 23 is provided is defined as a front side, and a side to which a camera unit 4 is provided is defined as a back side. A left-right direction is defined as a direction orthogonal to the up-down direction and also to the front-back direction. In FIG. 2, a side to which a holder 11 is provided is defined as a right side, and a side to which a GPS (Global Positioning System) antenna 7 is provided is defined as a left side. The directions defined as shown above will be used for explanation of shapes and positions of parts, elements and units of an electronic control apparatus. However, those definitions of the directions do not limit a direction in which the electronic control apparatus of the embodiment is mounted.

<1. Outline of the Electronic Control Apparatus>

Figure 2:
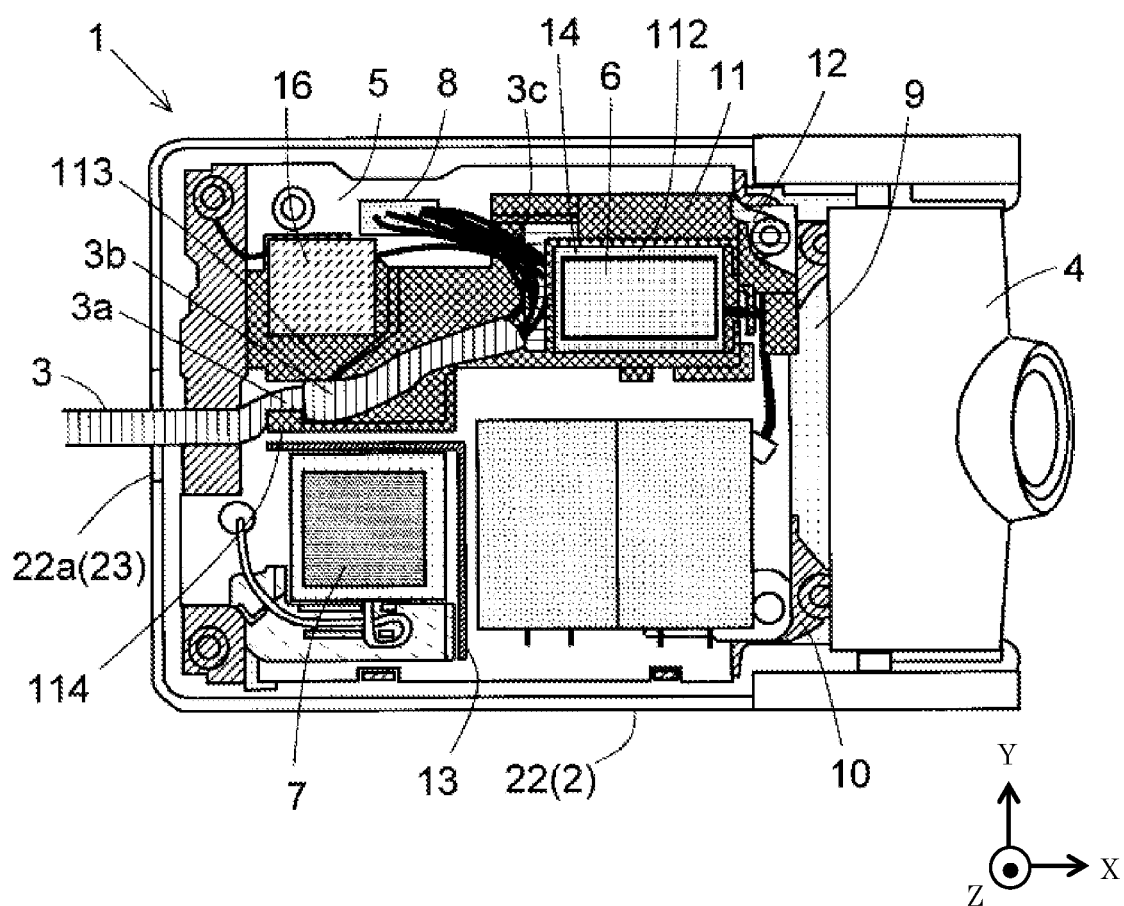
FIG. 2 illustrates a simplified plan view of the electronic control apparatus viewed from above after a top casing is removed from the electronic control apparatus.

FIG. 1 illustrates a simplified side view of an electronic control apparatus 1 of this embodiment. The electronic control apparatus 1 in this embodiment is a drive recorder. The electronic control apparatus 1 is installed, for example, on a front windshield (not illustrated) of a vehicle.

The electronic control apparatus 1 includes the case 2. The case 2 includes a top casing 21 and a bottom casing 22. The top casing 21 and the bottom casing 22 are fixed to each other with a fixture such as a screw. In this embodiment, a material of the case 2 is, for example, a resin, but is not limited to a resin. A material of the top casing 21 may be same as a material of the bottom casing 22, or may be different from the material of the bottom casing 22. The through hole 23 is provided on a front side of the case 2. The through hole 23 is provided so as to penetrate through the case 2 in the front-back direction. More specifically, the through hole 23 penetrates through a front wall of the case 2. In this embodiment, the through hole 23 is formed by combination of a cutout (not illustrated) provided to a front wall of the top casing 21 with a cutout 22a (see FIG. 2)

provided to a front wall of the bottom casing 22. The cutout on the front wall of the top casing 21 is a concavity that is opens downward, and the cutout on the front wall of the bottom casing 22 is a concavity that opens upward.

The electronic control apparatus 1 includes the cable 3. The cable 3 comes out of the case 2 through the through hole 23 provided to the case 2. In this embodiment, electricity is supplied from an outside power source to the electronic control apparatus 1 through the cable 3.

The electronic control apparatus 1 includes the camera unit 4 on a rear end of the electronic control apparatus 1. The camera unit 4 is rotatably held by the case 2. More specifically, the camera unit 4 rotates around a center axis that extends in the left-right direction (Y-axis direction in FIG. 2). Rotation of the camera unit 4 is limited to a predetermined range in this embodiment.

FIG. 2 illustrates a simplified plan view of the electronic control apparatus 1 viewed from above after the top casing 21 is removed from the electronic control apparatus 1 in FIG. 1. As shown in FIG. 2, the electronic control apparatus 1 includes the circuit board 5. The electronic parts, such as the loudspeaker 6, the GPS antenna 7 and a connection terminal 8, are mounted on the upper surface of the circuit board 5. In other words, the electronic control apparatus 1 includes the loudspeaker 6, and the case 2 of the electronic control apparatus 1 houses the circuit board 5 and the loudspeaker 6.

In this embodiment, electronic parts, such as a GPS tuner 70 (see FIG. 8) are mounted also on a lower side of the circuit board 5. The GPS tuner 70 processes GPS signals received by the GPS antenna 7. Moreover, in this embodiment, the electronic control apparatus 1 includes a circuit board 9 that is different from the circuit board 5 and that is provided below, at a predetermined distance away from, the circuit board 5. In this embodiment, the circuit board 5 may be described as first circuit board 5 and the circuit board 9 may be described as second circuit board 9. Those first and second circuit boards 5 and 9 are placed in the up-down direction at the predetermined distance away from each other, and an intermediate member 10 is provided between those first and second circuit boards 5 and 9. The intermediate member 10 is made of a metal plate. The intermediate member 10 is a substantially rectangular-shaped frame, and is a part of ground wiring. Electronic parts are mounted also on an upper surface and a lower surface of the second circuit board 9.

The loudspeaker 6 notifies a user of the vehicle of guidance, warning sound, other messages, and sound outputted when the user operates the electronic control apparatus 1. The loudspeaker 6 is mounted on the holder 11 provided on the upper side of the circuit board 5. In other words, the electronic control apparatus 1 includes the holder 11. The holder 11 is housed in the case 2 of the electronic control apparatus 1. The holder 11 is a resin molded insulator. The holder 11 extends in the front-back direction. In this embodiment, the holder 11 extends from a front end to a rear end of the circuit board 5. While the loudspeaker 6 is mounted on the holder 11, the holder 11 includes a holding structure to hold the cable 3 and a heat releasing structure. The holder 11 holds the loudspeaker 6 on a rear side of the holder 11 and holds the cable 3 on a front side more than the loudspeaker 6. A holding structure for the loudspeaker 6, the holding structure for the cable 3 and the heat releasing structure that are included in the holder 11 will be described later.

Figure 3:
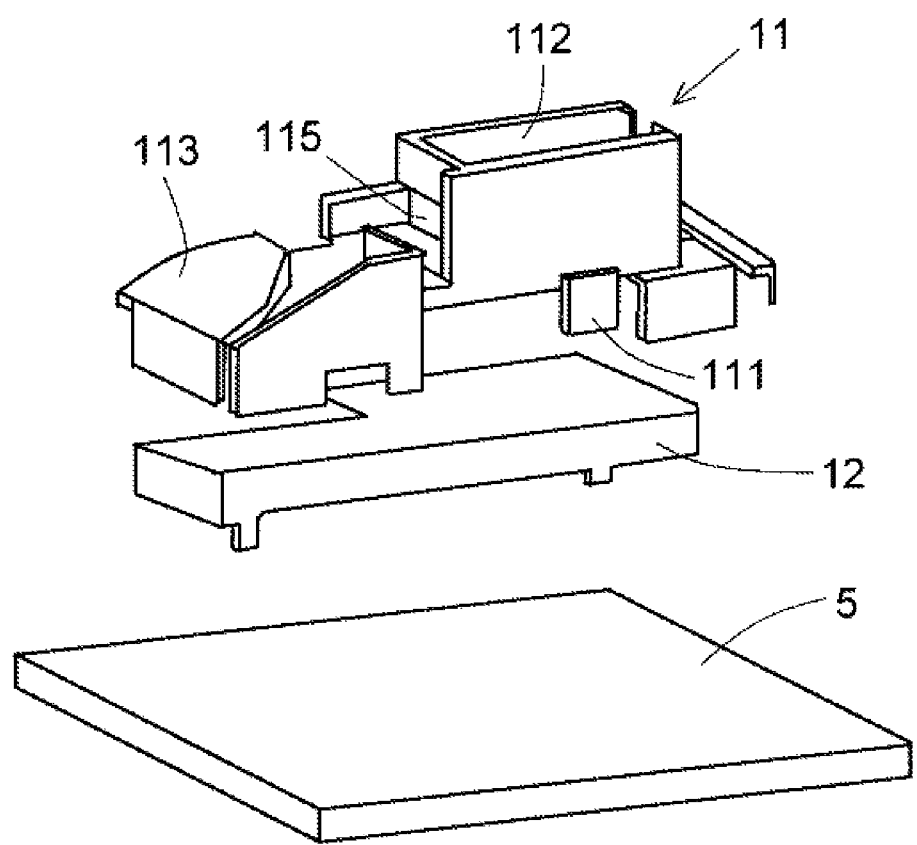
FIG. 3 is a simplified view illustrating a relationship between a circuit board and a holder.

FIG. 3 is a simplified view illustrating a relationship between the circuit board 5 and the holder 11. FIG. 3 is an exploded perspective view focusing on only a portion of parts that configure the electronic control apparatus 1. As shown in FIGS. 2 and 3, the electronic control apparatus 1 includes a metal plate member 12 that is provided between the circuit board 5 and the holder 11 in the up-down direction. In other words, the holder 11 is arranged on the upper side of the circuit board 5 via the metal plate member 12.

The metal plate member 12 is case-shaped and has an opening on a bottom thereof. The metal plate member 12 covers the electronic parts on the circuit board 5. The metal plate member 12 extends in the front-back direction in line with a shape of the holder 11. The metal plate member 12 is directly installed on the circuit board 5. In this embodiment, the metal plate member 12 is fixed to the circuit board 5 with screws and solder. The metal plate member 12 is electrically connected to a ground. The metal plate member 12 is a shield material that blocks high frequency noise generated by the electronic parts mounted on the circuit board 5.

The holder 11 is fixed to the metal plate member 12. The holder 11 is fixed to the metal plate member 12, for example, by tab fitting, using a tab 111 that the holder 11 includes. The holder 11 may be fixed to the metal plate member 12 with, for example, a double-faced adhesive tape or adhesive, instead of or in addition to the tab fitting.

Figure 8:
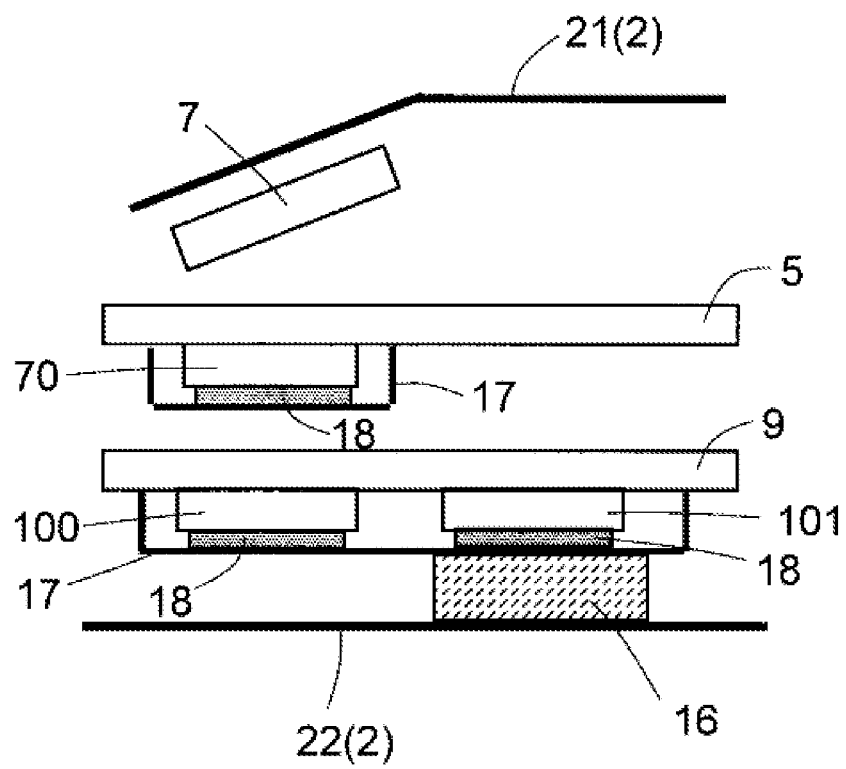
FIG. 8 illustrates a shield structure included in the electronic control apparatus.

The GPS antenna 7 is provided at a tilt relative to the circuit board 5 (see FIG. 8). In this embodiment, the GPS antenna 7 is positioned such that a rear end of the GPS antenna 7 is higher than a front end of the GPS antenna 7. Since the GPS antenna 7 is installed in the manner described above, the GPS antenna 7 easily faces upward. A shield plate 13 that is provided partially around the GPS antenna 7, is fixed on the upper side of the circuit board 5. The shield plate 13 is made of a metal plate. However, the shield plate 13 may be made of a non-metal material, for example, a conductive resin. The shield plate 13 extends in the up-down direction. More specifically, the shield plate 13 is L-shaped when the shield plate 13 is viewed above in the up-down direction. The shield plate 13 partially surrounds the GPS antenna 7. The shield plate 13 is electrically connected to a ground. The shield plate 13 protects the GPS antenna 7 from adverse effect of the high frequency noise.

The connection terminal 8 is fixed to the circuit board 5. The connection terminal 8 is, for example, soldered to be fixed to the circuit board 5. The connection terminal 8 is electrically connected to one end of the cable 3. In other words, the cable 3 is electrically connected to the circuit board 5 via the connection terminal 8.

<2. Holding Structure for the Loudspeaker>

As illustrated in FIGS. 2 and 3, the holder 11 includes a loudspeaker concavity 112 opening upward on an upper rear side of the holder 11. The loudspeaker 6 is placed in the loudspeaker concavity 112. When being viewed from above, the loudspeaker concavity 112 is rectangular to fit the loudspeaker 6 that is a cuboid.

Figure 4:
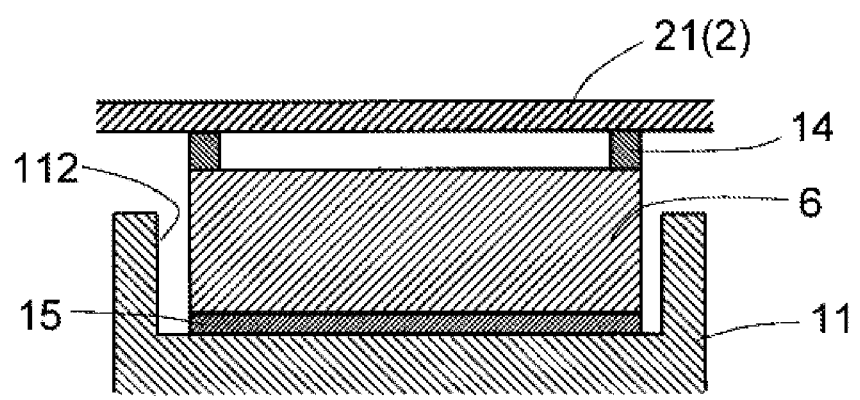
FIG. 4 is a simplified cross sectional view illustrating a holding structure for the loudspeaker of the electronic control apparatus.

FIG. 4 is a simplified cross sectional view illustrating the holding structure for the loudspeaker 6 of the electronic control apparatus 1. As illustrated in FIG. 4, an upper portion of the loudspeaker 6 placed in the loudspeaker concavity 112 projects out from an upper surface of the loudspeaker concavity 112, in this embodiment.

As shown in FIG. 4, the electronic control apparatus 1 includes an elastic cushioning member 14 that is provided to an upper side of the loudspeaker 6. The cushioning member 14 is housed in the case 2. In this embodiment, the cushioning member 14 is substantially rectangle frame-shaped. The cushioning member 14 is provided along an outer circumference of an upper surface of the loudspeaker 6. The cushioning member 14 is fixed to the loudspeaker 6. For example, adhesion is used to fix the cushioning member 14 to the loudspeaker 6. The cushioning member 14 can be made of any elastic material, such as resin foam.

The case 2 is in contact with an upper end of the cushioning member 14. In this embodiment, a lower surface of the top casing 21 is in contact with the upper end of the cushioning member 14. Thus, vibrations of sound produced by the loudspeaker 6 are transmitted to the case 2 via the cushioning member 14. Since the vibrations of the sound produced by the loudspeaker 6 are transmitted to the case 2 via the cushioning member 14, sound pressure is increased by vibrations of the case 2 so that it is possible for the electronic control apparatus 1 to output the sound produced by the loudspeaker 6 at a high volume. Thus, even if an output aperture for sound produced by the loudspeaker 6 is not provided to the case 2, a user can fully catch the sound produced by the loudspeaker 6. Moreover, since no output aperture for sound is provided to the case 2, it is possible to prevent dust, dirt, etc. from entering the electronic control apparatus 1.

Moreover, in this embodiment, the electronic control apparatus 1 is incorporated with the camera unit 4 as one unit, but in some cases, the electronic control apparatus 1 is separate from the camera unit 4. Further, the electronic control apparatus may be installed, for example, inside a dashboard of a vehicle. Even in this case, since the electronic control apparatus outputs sound at a high volume, it is possible to sufficiently deliver the sound produced by the loudspeaker 6, to the user. In this example case, the camera unit separated from the electronic control apparatus is installed on the front windshield of the vehicle. The camera unit and the electronic control apparatus send and receive signals to/from each other wirelessly or by wire.

Moreover, in this embodiment, in order to efficiently transmit the sound produced by the loudspeaker 6 to the top casing 21, the cushioning member 14 variable in height in the up-down direction is provided between the loudspeaker 6 and the top casing 21 in the up-down direction. Thus, even if variation in a distance between the loudspeaker 6 and the top casing 21 occurs in manufacturing, the cushioning member 14 is surely in contact with the top casing 21. In other words, it is possible to lower the possibility of manufacturing the electronic control apparatus 1 having a trouble in producing high volume sound due to the variation in the distance between the loudspeaker 6 and the top casing 21.

Moreover, in this embodiment, the electronic control apparatus 1 includes a double-faced adhesive tape 15 that is provided between the holder 11 and the loudspeaker 6 in the up-down direction. The double-faced adhesive tape 15 adheres to the holder 11 and the loudspeaker 6 to each other. More specifically, the double-faced adhesive tape 15 is provided between a lower surface of the loudspeaker 6 and a lower surface of the loudspeaker concavity 112 on which the loudspeaker 6 is mounted. A rear surface of the loudspeaker 6 is the lower surface of the loudspeaker 6 because the loudspeaker 6 is placed in the holder 11 so as to face up. The double-faced adhesive tape 15 adheres to the loudspeaker 6 and the holder 11 to each other. Thus, the loudspeaker 6 is fixed to the holder 11. This configuration can prevent a void from occurring behind the rear surface (the lower surface) of the loudspeaker 6 so that the vibrations of sounds produced by the loudspeaker 6 can be transmitted to the top casing 21 with small loss. In other words, the electronic control apparatus 1 outputs sounds at a high volume.

<3. Heat Releasing Structure>

Figure 5:
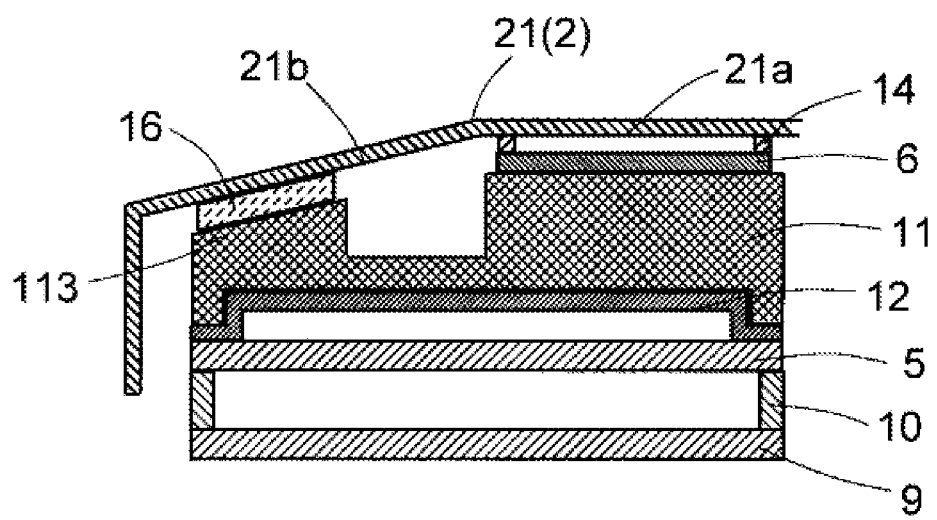
FIG. 5 is a simplified cross-sectional view illustrating a heat releasing structure of the electronic control apparatus.

FIG. 5 is a simplified cross-sectional view illustrating the heat releasing structure of the electronic control apparatus 1. As shown in FIG. 5, the metal plate member 12 provided between the circuit board 5 and the holder 11 in the up-down direction is in contact with the circuit board 5 and the holder 11. The metal plate member 12 may be thermally in contact with the circuit board 5 and the holder 11. A thermal conductive material may be provided between the metal plate member 12 and the circuit board 5 and/or the metal plate member 12 and the holder 11. Such a thermal conductive material may be regarded as a part of the circuit board 5 or the holder 11.

The electronic control apparatus 1 is provided between the holder 11 and the case 2 in the up-down direction. The electronic control apparatus 1 includes a heat releasing member 16 that is in contact with the holder 11 and the case 2 to transmit heat from the holder 11 to the case 2. In this embodiment, the heat releasing member 16 is a heat releasing sheet made of a special polymer. The heat releasing member 16 is adherent and elastic. However, the heat releasing member 16 may be made of another heat-releasable material such as a metal. The heat releasing member 16 may be thermally in contact with the holder 11 and the case 2. A thermal conductive material may be provided between the heat releasing member 16 and the holder 11 and/or between the heat releasing member 16 and the case 2. Such a thermal conductive material may be regarded as a part of the holder 11 or the case 2.

According to the configuration of this embodiment, heat of the circuit board 5 or above the circuit board 5 is transmitted to the metal plate member 12, the holder 11, the heat releasing member 16 and then the case 2 in order. Then, the heat is released outside the electronic control apparatus 1. As described above, since the electronic parts are mounted on the lower surface of the first circuit board 5 and the upper surface of the second circuit board 9, heat is easily accumulated between the first circuit board 5 and the second circuit board 9 in the configuration of this embodiment. The heat releasing structure of this embodiment can effectively reduce adverse effect caused by the heat.

It is recommended that the holder 11 should be made of a high thermal conductive material. The holder 11 of this embodiment is made of a thermal (heat) conductive resin. Thus, the holder 11 effectively transmits, to the heat releasing member 16, the heat transmitted from the metal plate member 12. Thus, it is possible to improve heat releasing performance of the electronic control apparatus 1. The resin material as a base material of the thermal conductive resin may include a high thermal conductive filler. Since it is recommended that the holder 11 should be an insulator, it is recommended that the thermal conductive filler should be a glass fiber or an inorganic filler.

The holder 11 includes a heat releasing material holding portion 113 on a front side of the holder 11, in this embodiment. An upper surface of the heat releasing material holding portion 113 is tilted relative to the circuit board 5. The tilted surface is a plane surface. A front end of the heat releasing material holding portion 113 is located lower than a rear end of the heat releasing material holding portion 113. An upper surface and a lower surface of the plate-shaped heat releasing member 16 are tilted relative to the circuit board 5 due to the tilted upper surface of the heat releasing material holding portion 113.

The case 2 includes a first surface 21a that is in contact with the cushioning member 14 and a second surface 21b that is in contact with the heat releasing member 16.

Specifically, the top casing 21 includes the first surface 21a and the second surface 21b. The first surface 21a is parallel to the circuit board 5. The second surface 21b is tilted relative to the circuit board 5 and extends from the first surface 21a. In this embodiment, the second surface 21b is substantially parallel to the upper surface of the heat releasing material holding portion 113 and to the upper surface of the heat releasing member 16.

In this embodiment, the cushioning member 14 and the heat releasing member 16 are not in contact with one same surface of the top casing 21, but are in contact with the first surface 21a and the second surface 21b, respectively, of which tilted angles are different from each other relative to the circuit board 5. Thus, it is easy to cause both of the cushioning member 14 and the heat releasing member 16 to be in contact with the top casing 21.

<4. Cable Holding Structure>

As shown in FIG. 2, a portion of the cable 3 that is housed inside the case 2 is held by a part of the holder 11, and an end of the cable 3 is connected to the connection terminal 8. The holder 11 guides the cable 3 to lead the end of the cable 3 to the connection terminal 8, and has a function of holding the cable 3.

Figure 6:
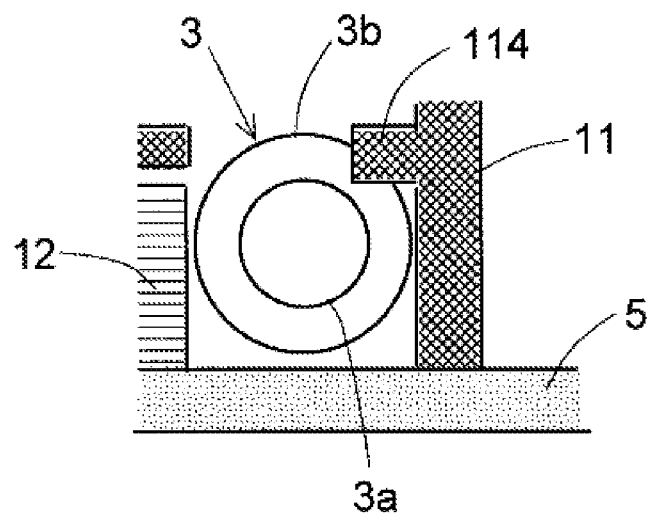
FIG. 6 is a schematic diagram illustrating a relationship between a cable and the holder.

FIG. 6 is a schematic diagram illustrating a relationship between the cable 3 and the holder 11. As shown in FIGS. 2 and 6, the cable 3 includes a first portion 3a and a second portion 3b of which diameters are different from each other. The diameter of the second portion 3b is greater than the diameter of the first portion 3a. A difference of the diameters of the first portion 3a and the second portion 3b may be generated by connecting two types of cables different from each other, or, for example, by wrapping a flexible member around the cable 3.

As shown in FIGS. 2 and 6, the holder 11 includes a stopper 114 that abuts on the second portion 3b to control movement of the second portion 3b toward the through hole 23. The second portion 3b abuts on a rear surface of the stopper 114. The stopper 114 is a protrusion that protrudes from a side wall of the holder 11 toward an inside of the holder 11 in the left-right direction. In this embodiment, the stopper 114 is the protrusion that protrudes from a left wall of the holder 11 toward a right side of the holder 11. It is recommended that a material of the stopper 114 should be the same as the material of the holder 11, but may be different from the material of the holder 11.

In this embodiment, the stopper 114 has one protrusion. However, the stopper 114 may include a plurality of the protrusions. Moreover, in this embodiment, the stopper 114 is the protrusion that protrudes from the left wall of the holder 11. However, the stopper 114 may be configured by a pair of protrusions facing to each other protruding from the left wall and a right wall of the holder 11, or the stopper 114 may be configured by a protrusion protruding from the right wall of the holder 11.

In addition, the stopper 114 should control the movement of the second portion 3b toward the through hole 23, but a shape of the stopper 114 is not specifically defined. However, it is recommended that the stopper 114 should be configured so as not to prevent movement of the first portion 3a in the front-back direction. Further, it is recommended that the stopper 114 should be provided such that a lower portion of the stopper 114 partially abuts on the first portion 3a to prevent the cable 3 from easily being unhooked from the holder 11 when the first portion 3a of the cable 3 is lifted. On the other hand, it is recommended that the stopper 114 should face to one of walls, of the holder 11, that face to each other in the left-right direction, and that there should be a space between the stopper 114 and the one wall, such that the cable 3 can be unhooked from the holder 11 when the first portion 3a of the cable 3 is lifted with a relatively large force.

In a case where a force pulling the cable 3 is applied from an outside of the case 2, it is possible to prevent the force from being applied to the connection terminal 8 because the stopper 114 is provided to the holder 11. Thus, it is possible to prevent the connection terminal 8 from being detached from the circuit board 5 or prevent the cable 3 from being disconnected. Moreover, since the cable 3 is held by the holder 11, it is possible to prevent the cable 3 from being pulled while being caught on a part other than the holder 11. Thus, it is possible to protect parts inside the case 2. In a case where the electronic control apparatus 1 is installed on the front windshield of the vehicle, the cable 3 is laid all around inside the vehicle. Thus, force is relatively frequently applied to the cable 3. This embodiment can reduce occurrence of disconnection of the cable 3 even in a circumstance in which an outside force is relatively frequently applied to the cable 3.

Figure 7:
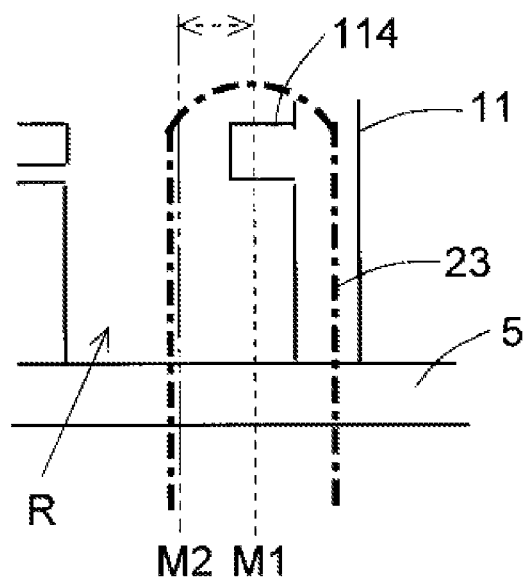
FIG. 7 illustrates a relationship, in an area in which a stopper is provided, between a through hole and a passable region for the first portion of the cable.

FIG. 7 illustrates a relationship, in an area in which the stopper 114 is provided, between the through hole 23 and a passable region R for the first portion 3a of the cable 3. FIG. 7 illustrates the relationship, in a planar view viewed from a front side in the front-back direction (front view), between the passable region R and the through hole 23. As shown in FIG. 7, in the planar view in the front-back direction, a center line M1 in the left-right direction of the through hole 23 does not match a center line M2 of the passable region R for the cable 3, in the left-right direction, in the area in which the stopper 114 is provided. In this embodiment, the center line M1 is located on a left side of the center line M2 (right side in FIG. 7 viewed from the front side).

As is the case of the center line M1 and the center line M2, a left end and a right end of the through hole 23 do not match a left end and a right end of the passable region R, respectively. In this embodiment, the left end of the through hole 23 is located on a left side of the left end of the passable region R, and the right end of the through hole 23 is also located on a left side of the right end of the passable region R.

In such a configuration, the cable 3 in the case 2 is curved in an S-shape due to the stopper 114 in a front region of the case 2, as shown in FIG. 2. Thus, in a case where a force pulling the cable 3 from an outside of the case 2 is applied, the S-shaped curve prevents a force from being straightly applied to the stopper 114, and causes the force to be applied to the stopper 114 at an angle. Thus, the stopper 114 can be prevented from being broken.

As shown in FIG. 2, the cable 3 of this embodiment includes a portion that is laid further away from the through hole 23 than the connection terminal 8 in the front-back direction. In other words, the cable 3 has the portion that is laid in a back side of the connection terminal 8. The connection terminal 8 is located further away from the through hole 23 than the stopper 114 in the front-back direction. In other words, the connection terminal 8 is provided in a back side of than the stopper 114. In such a configuration, the portion of the cable 3 held by the holder 11 needs to be longer than a length that the cable 3 essentially needs. Thus, even if a length of the cable 3 that is laid in the case 2 varies, it is possible to prevent an excessive force from being applied to the connection terminal 8.

In this embodiment, the portion that is laid in a back side of the connection terminal 8 includes a curved portion 3c (see FIG. 2). The holder 11 includes a cable concavity 115 that is concaved backward (see FIG. 3). At least a portion of the curved portion 3c is placed in the cable concavity 115. Thus, there is less possibility that the curved portion 3c is caught on another part in the case 2.

<5. Shield Structure>

The electronic control apparatus 1 includes a GPS part for use of GPS including the GPS antenna 7 and the GPS tuner 70. GPS reception performance of these GPS parts may be decreased by influence of high frequency noise. The electronic control apparatus 1 includes a shield structure to reduce such a failure. FIG. 8 illustrates the shield structure included in the electronic control apparatus 1.

As shown in FIG. 8, the electronic control apparatus 1 includes a CPU (Central Processing Unit) 100 that controls the entire electronic control apparatus 1 and a memory 101 that stores programs and information. The CPU 100 and the memory 101 may be noise sources that release high frequency noise. In the electronic control apparatus 1, the CPU 100 and the memory 101 are mounted on the lower surface of the second circuit board 9. On the other hand, the GPS antenna 7 and the GPS tuner 70 are mounted on the first circuit board 5. More specifically, the GPS antenna 7 is mounted on the upper surface of the first circuit board 5, and the GPS tuner 70 is mounted on the lower surface of the first circuit board 5. In other words, the CPU 100 and the memory 101, the noise sources, are mounted physically as far away from the GPS antenna 7 and the GPS tuner 70 as possible. Thus, it is possible to reduce possibility that the GPS antenna 7 and the GPS tuner 70 are affected by the high frequency noise.

Moreover, as described above, the shield plate 13 is provided around the GPS antenna 7 (see FIG. 2). As shown in FIG. 8, the GPS tuner 70 is covered by a shield cover 17 that is metal and is electrically connected to a ground.

Further, as shown in FIG. 8, the CPU 100 and the memory 101, the high frequency noise sources, are covered by the metal shield cover 17 that is electrically connected to the ground. Thus, it is possible to prevent the high frequency noise released from the CPU 100 and the memory 101 from leaking to an outside of the shield cover 17. Moreover, a material of the shield cover 17 is not limited to metal, but, for example, may be a conductive resin.

Figure 9:
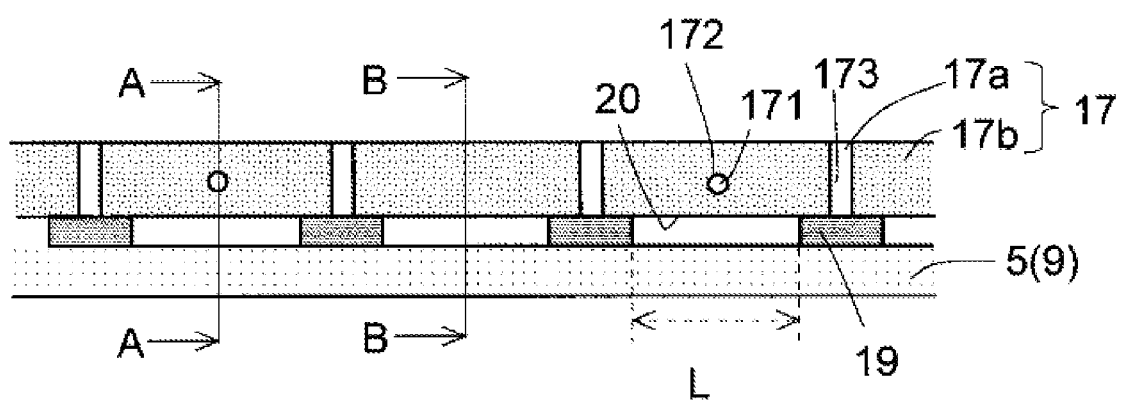
FIG. 9 is a schematic diagram illustrating a relationship between a shield cover and the circuit board.
Figure 10:
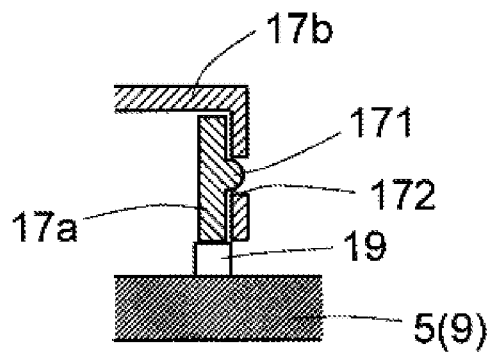
FIG. 10 illustrates a simplified cross-sectional view of the shield cover and the circuit board along the line A-A in FIG. 9.
Figure 11:
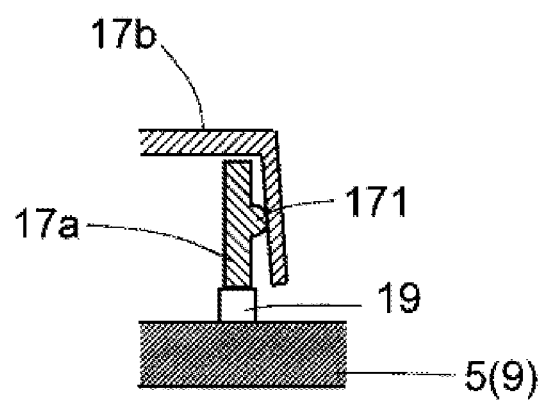
FIG. 11 illustrates a simplified cross-sectional view of the shield cover and the circuit board along the line B-B in FIG. 9.

FIG. 9 is a schematic diagram illustrating a relationship between the shield cover 17 and the circuit board 5 (or the circuit board 9). FIG. 10 illustrates a simplified cross-sectional view of the shield cover 17 and the circuit board 5 along the line A-A in FIG. 9. FIG. 11 illustrates a simplified cross-sectional view of the shield cover 17 and the circuit board 5 along the line B-B in FIG. 9. The shield cover 17 is fixed to the circuit board 5 (9) with a joining member 19. In this embodiment, the joining member 19 is solder. The shield cover 17 is soldered to the circuit board 5 (9) by a reflow method.

As shown in FIG. 9, a space is formed between the shield cover 17 and the circuit board 5 (9) in the up-down direction. The space is divided into slits by a plurality of points soldered. Thus, a plurality of the slits 20 are formed between the shield cover 17 and the circuit board 5 (9) in the up-down direction. A length L of the slits 20 formed between two soldered points next to each other is set to a distance through which noise at a predetermined frequency less passes. The predetermined frequency is, for example, a maximum frequency, i.e. 5 GHz, of the high frequency noise. In a case where the a wavelength of the predetermined frequency noise is λ, the length L of the slits 20 is set to λ/10 or smaller (in a case of 5 GHz noise, the length L is 6 mm or smaller). It is recommended that the length L of the slits 20 should be λ/20 or smaller.

Specifically, the shield cover 17 includes a first member 17a and a second member 17b. The first member 17a is frame-shaped and is soldered on the circuit board 5 (9). The second member 17b is box-shaped, and covers the first member 17a. The second member 17b is fixed to the first member 17a. A plurality of convexities 171 are provided, at predetermined intervals in a direction orthogonal to the up-down direction (ex. the left-right direction and a front-back direction), to an outer surface of the first member 17a. The outer surface of the first member 17a is parallel to the up-down direction. On the other hand, apertures 172 are provided on a side surface of the second member 17b, as shown in FIG. 10, to which the convexities 171 are inserted. The apertures 172 are through holes on the side surface of the second member 17b. By fitting the convexities 171 to the apertures 172, the second member 17b is fixed to the first member 17a.

In this embodiment, as shown in FIG. 11, some of the convexities 171 are not inserted into the apertures 172, but abut on an inner surface of the second member 17b. Reaction force is generated by elastic deformation of the second member 17b in areas in which the convexities 171 abut on the inner surface of the second member 17b. Thus, as compared with a case in which the second member 17b is fixed to the first member 17a only by inserting the convexities 171 into the apertures 172, rattle of the second member 17b to the first member 17a can be decreased. A plurality of cutouts 173 are provided to the side surface of the second member 17b at predetermined intervals in a direction orthogonal to the up-down direction. The side surface of the second member 17b is parallel to the up-down direction. Since the cutouts 173 are provided, the second members 17b is easily elastically deformed when the second members 17b is in contact with the convexities 171.

Each of the cutouts 173 is positioned between two convexities 171 next to each other when the second member 17b is installed to the first member 17a. For example, the cutouts 173 are positioned in a substantially center between two convexities 171 next to each other. It is recommended that each of the cutouts 173 should be positioned on a location in which the solder 19 is provided in a planar view viewed from the up-down direction. In such a configuration, the convexities 171 are fitted into the apertures 172 away from locations in which the solder 19 is provided. Thus, it is possible to decrease a problem that the convexities 171 are not fitted into the apertures 172 due to adverse effect of the solder 19 that is flexibly changed in shape by reflow.

Moreover, in this embodiment, as shown in FIG. 8, the shield cover 17 is thermally in contact with the GPS tuner 70, the CPU 100 and the memory 101 via thermal grease 18. Thus, the heat generated by the GPS tuner 70, the CPU 100 and the memory 101 can be released to the outside of the shield cover 17 so that it is possible to prevent the heat from staying inside the shield cover 17.

Further, the heat releasing member 16 is provided to the outside of the shield cover 17 that covers the CPU 100 and the memory 101. More specifically, as shown in FIG. 8, the heat releasing member 16 is provided on the lower surface of the shield cover 17. The heat releasing member 16 is in contact with the case 2. More specifically, the heat releasing member 16 is in contact with the bottom casing 22. Thus, the heat generated from the CPU 100 and the memory 101 is transmitted to the heat releasing member 16 via the shield cover 17. Then, the heat is transmitted to the bottom casing 22 from the heat releasing member 16. Thus, a heat releasing performance of the electronic control apparatus 1 can be improved. In this embodiment, the heat releasing member 16 is a heat releasing sheet made of special polymer, as described above.

<6. Notes>

The configurations of the embodiment and the modification examples in this specification are only examples of this invention. The configurations of the embodiment and the modifications may be changed arbitrarily without departing from the scope of the invention. Moreover, the embodiment and the modifications may be arbitrarily combined as far as possible.

The foregoing embodiment explains a case of a drive recorder, as an example. However, the invention is not limited to the drive recorder, but can be applied to a wide range of electronic control apparatuses including a loudspeaker. This invention can be optimally applied to electronic control apparatuses including a loudspeaker, such as a drive recorder and ETC devices.

While the invention has been shown and described in detail, the foregoing description is in all aspects illustrative and not restrictive. It is therefore understood that numerous other modifications and variations can be devised.

What is claimed is:

1. An electronic control apparatus comprising:
   a first circuit board;
   a holder provided to an upper side of the first circuit board;
   a loudspeaker mounted on the holder;
   a cushioning member that is elastic and is mounted on an upper side of the loudspeaker;
   a case that is in contact with the cushioning member, and that houses the first circuit board, the holder and the loudspeaker;
   a metal plate member that is provided between the first circuit board and the holder in the up-down direction, and that is in contact with the first circuit board and the holder; and
   a heat releasing member that is provided between the holder and the case in the up-down direction, and that is in contact with the holder and the case to transmit heat from the holder to the case.

2. The electronic control apparatus according to claim 1, further comprising:
   a double-faced adhesive tape that is provided between the holder and the loudspeaker in an up-down direction, and that adheres to the holder and the loudspeaker to each other.

3. The electronic control apparatus according to claim 1, wherein
   the holder is made of a heat conductive resin.

4. The electronic control apparatus according to claim 1, further comprising:
   a second circuit board that is provided below, at a predetermined distance away from, the first circuit board in the up-down direction.

5. The electronic control apparatus according to claim 1, wherein
   the case includes:
     a first surface that is parallel to the first circuit board; and
     a second surface that is tilted relative to the first circuit board and that extends from the first surface,
   the cushioning member is in contact with the first surface, and
   the heat releasing member is in contact with the second surface.

6. The electronic control apparatus according to claim 1, further comprising:
   a cable that is electrically connected to the first circuit board via a connection terminal, and that extends through a through hole on the case to an outside of the case, wherein
   the cable include a first portion and a second portion, the second portion having a diameter that is greater than a diameter of the first portion, and
   the holder includes a stopper that i) abuts on the second portion, and ii) controls movement of the second portion toward the through hole.

7. The electronic control apparatus according to claim 6, wherein
   the through hole penetrates through a wall of the case in a front-back direction orthogonal to the up-down direction, and
   in a planar view in the front-back direction, a center of the through hole in a left-right direction does not match a center of a passable region for the first portion of the cable in the left-right direction, in an area in which the stopper is provided.

8. The electronic control apparatus according to claim 6, wherein
   the through hole penetrates through a wall of the case in a front-back direction orthogonal to the up-down direction,
   the connection terminal is located further away from the through hole than the stopper in the front-back direction, and
   the cable includes a portion that is laid further away from the through hole than the connection terminal in the front-back direction.

* * * * *